United States Patent
Bengoechea De La Llera

(10) Patent No.: US 11,789,043 B2
(45) Date of Patent: Oct. 17, 2023

(54) METHOD AND APPARATUS FOR MEASURING THE CURRENT CIRCULATING THROUGH A CONDUCTOR

(71) Applicant: LUMIKER APLICACIONES TECNOLÓGICAS S.L., Derio (ES)

(72) Inventor: Francisco Javier Bengoechea De La Llera, Loiu (ES)

(73) Assignee: LUMIKER APLICACIONES TECNOLÓGICAS S.L., Derio (ES)

( * ) Notice: Subject to any disclaimer, the term of this patent is extended or adjusted under 35 U.S.C. 154(b) by 49 days.

(21) Appl. No.: 17/682,491

(22) Filed: Feb. 28, 2022

(65) Prior Publication Data
US 2022/0178973 A1  Jun. 9, 2022

Related U.S. Application Data

(63) Continuation-in-part of application No. 17/029,399, filed on Sep. 23, 2020, now abandoned.

(30) Foreign Application Priority Data

Sep. 25, 2019 (EP) .................................... 19382824

(51) Int. Cl.
*G01R 15/22* (2006.01)
*G01R 19/00* (2006.01)

(52) U.S. Cl.
CPC ......... *G01R 15/22* (2013.01); *G01R 19/0092* (2013.01)

(58) Field of Classification Search
CPC ......... G01R 15/22; G01R 15/24; G01R 19/00
See application file for complete search history.

(56) References Cited

U.S. PATENT DOCUMENTS 4,644,153 A * 2/1987 Ida .......................... G01D 5/344
                                                            250/231.19
5,004,913 A * 4/1991 Kleinerman ............ G06F 3/041
                                                            374/161
(Continued)

FOREIGN PATENT DOCUMENTS

CN      102539873 A     7/2012
CN      203011982 U     6/2013
(Continued)

OTHER PUBLICATIONS

Lin et al., "Fiber-Optic Current Sensor Using Passive Demodulation Interferometric Scheme," Fiber and Integrated Optics, London, Great Britain, vol. 18, No. 2, Jan. 1, 1999, pp. 79-92 (14 pages).

(Continued)

*Primary Examiner* — Dominic E Hawkins
(74) *Attorney, Agent, or Firm* — Edell, Shapiro & Finnan, LLC

(57) ABSTRACT

Optical fiber-based measuring equipment for measuring the current circulating through at least one conductor. The measuring equipment includes an interrogator and a sensing portion connected to the interrogator and configured for being arranged in the proximity of the conductor. The sensing portion includes a first input branch and a second input branch coupled by means of a splitter to a first sensing branch and to a second sensing branch. The first sensing branch includes a first optical fiber winding arranged in the proximity of the conductor, and the second sensing branch includes a second optical fiber winding arranged in the proximity of the conductor, the first optical fiber winding and the second optical fiber winding having the same number of turns that are, however, wound in opposite directions.

16 Claims, 2 Drawing Sheets

(56) References Cited

U.S. PATENT DOCUMENTS

| | | | |
|---|---|---|---|
| 5,502,373 A | 3/1996 | Ryczek et al. | |
| 5,963,026 A | 10/1999 | Bosselmann | |
| 6,297,625 B1 | 10/2001 | Bosselmann | |
| 6,301,400 B1 | 10/2001 | Sanders | |
| 6,438,234 B1 | 8/2002 | Gisin | |
| 6,495,999 B1* | 12/2002 | Beierl | G01R 15/246 324/96 |
| 6,498,654 B1 | 12/2002 | Cusark | |
| 6,515,467 B1 | 2/2003 | Bosselmann | |
| 6,636,321 B2 | 10/2003 | Bohnert | |
| 2006/0038115 A1 | 2/2006 | Maas | |
| 2006/0176490 A1* | 8/2006 | Suzuki | G01K 11/00 356/479 |
| 2007/0065156 A1 | 3/2007 | Lin | |
| 2011/0051145 A1 | 3/2011 | Haywood | |
| 2012/0121216 A1 | 5/2012 | Oh | |
| 2012/0283969 A1* | 11/2012 | Bohnert | G01R 15/246 702/64 |
| 2014/0361762 A1* | 12/2014 | Wallace | G01R 15/246 324/96 |
| 2018/0095113 A1* | 4/2018 | Bengoechea De La Llera | G01R 19/0092 |

FOREIGN PATENT DOCUMENTS

| | | |
|---|---|---|
| CN | 106645911 A | 5/2017 |
| DE | 4227903 C1 | 7/1993 |
| EP | 0729033 A2 | 8/1996 |
| EP | 19382824.1 | 9/2019 |
| EP | 3598149 A1 | 1/2020 |
| JP | S57184975 A | 11/1982 |
| JP | H01292263 A | 11/1989 |
| WO | 2016198575 A1 | 12/2016 |

OTHER PUBLICATIONS

Ning et al., "Recent Progress In Optical Current Sensing Techniques," Review of Scientific Instruments, AIP, New York, US, vol. 66, No. 5, May 1, 1995, pp. 3097-3111 (16 pages).

Short et al., "Elimination of Birefringence Induced Scale Factor Errors in the In-Line Sagnac Interferometer Current Sensor," Journal of Lightwave Technology, IEEE, USA, vol. 16, No. 10, Oct. 1, 1998 (8 pages).

Lee et al., "A Polarimetric Current Sensor Using An Orthogonally Polarized Dual-Frequency Fibre Laser," Measurement Science and Technology, IOP, Bristol, Great Britain, vol. 9, No. 6, Jun. 1, 1998 pp. 952-959 (8 pages).

Bush et al., "Dual-channel Faraday-effect current sensor capable of simultaneous measurement of two independent currents," Optics Letters, Optical Society of America, US, vol. 16, No. 12, Jun. 15, 1991, pp. 955-957 (3 pages).

Cao et al., "A Novel Design of Fiber-Optic Sagnac Current Sensor," 2012 Fifth International Symposium on Computational Intelligence and Design (ISCID), IEEE, Oct. 28, 2012, pp. 89-92 (4 pages).

Wang et al., "Recent advances in optical current-sensing techniques," Sensors and Actuators A 50, vol. 50, No. 3, Sep. 1, 1995, pp. 169-175 (7 pages).

Extended European Search Report received in European patent application No. 19382824.1 dated Mar. 27, 2020 (22 pages).

* cited by examiner

METHOD AND APPARATUS FOR MEASURING THE CURRENT CIRCULATING THROUGH A CONDUCTOR

CROSS-REFERENCE TO RELATED APPLICATIONS

This application is a continuation-in-part of U.S. application Ser. No. 17/029,399, filed Sep. 23, 2020, which relates to and claims the benefit and priority to European Application No. 19382824.1, filed Sep. 25, 2019.

TECHNICAL FIELD

The present invention relates to optical fiber-based current measuring equipment for measuring the current circulating through a conductor, and to a method for measuring the current circulating through a conductor with optical fiber-based current measuring equipment.

BACKGROUND

Optical fiber-based sensors for measuring the current circulating through a conductor are known. Said sensors work according to the Faraday effect, i.e., the magnetic field generated by the current circulating through the conductor causes a rotation in the polarization of light circulating through the optical fiber arranged around the conductor. The operation of optical fiber-based measuring equipment consists of emitting light through an optical fiber towards a sensing portion in which the characteristics of the light are modified depending on the current circulating through the conductor, and analyzing the rotation caused in the polarization of light to determine the magnitude of the current passing through the conductor.

WO2016198575A1, belonging to the same applicant and incorporated herein by reference in its entirety, describes optical fiber-based current measuring equipment and an associated method. The current measuring equipment comprises an interrogator with an emitter and a receiver, and a sensing portion close to the conductor. The interrogator and the sensing portion are suitable for being connected through a standard single-mode intermediate fiber. The patent document describes several ways for implementing both the interrogator and the sensing portion. In one of the embodiments, the sensing portion comprises a first branch comprising a first polarizer and a fiber twist after said first polarizer, a second branch comprising a second polarizer, and a sensing branch comprising a sensing section arranged in the proximity of the conductor and a mirror. The first branch and the second branch are coupled to the sensing branch by means of a splitter.

In the method described for this embodiment, the pulses emitted by the emitter are received in the sensing branch through the first branch, whereas the pulses modified depending on the current circulating through the conductor are received by the receiver from the second branch.

SUMMARY

Disclosed is optical fiber-based current measuring equipment for measuring the current circulating through at least one conductor, and a method for measuring the current circulating through at least one conductor with optical fiber-based measuring equipment.

A first aspect of the invention relates to optical fiber-based measuring equipment for measuring the current circulating through at least one conductor.

The measuring equipment comprises an interrogator comprising a first emitter, a second emitter, a first receiver, and a second receiver.

The measuring equipment also comprises a sensing portion connected to the interrogator and configured for being arranged in the proximity of the conductor.

The sensing portion comprises a first input branch comprising a first polarizer and a fiber twist after said first polarizer, and a second input branch comprising a second polarizer.

The sensing portion also comprises a first sensing branch comprising a first optical fiber winding arranged in the proximity of the conductor and a first Faraday mirror, and a second sensing branch comprising a second optical fiber winding arranged in the proximity of the conductor, a second Faraday mirror, and a delaying element between the second optical fiber winding and the second Faraday mirror.

The first input branch and the second input branch are coupled to the first sensing branch and to the second sensing branch by means of a splitter.

The first optical fiber winding and the second optical fiber winding comprise the same number of turns that are, however, wound in opposite directions. As the two optical fiber windings have the same length but are arranged opposite one another, they exhibit the same response in the deviation of light polarization, but in phase opposition, i.e., with a 180-degree offset. This configuration allows determining the current circulating through the conductor in a very precise manner, particularly in values in which the current circulating through the conductor is low, and therefore the signal/noise ratio is high, given that this configuration allows for good noise cancelation without having to use filters to eliminate said noise. Likewise, obtaining very good noise elimination offers very good measurements of the conductors through which direct current circulates and in which filters cannot be used. Furthermore, by processing the signals obtained in the first receiver and in the second receiver, it is possible to obtain a precise calculation of the fiber twist of the first input branch and of the attenuations caused by the different connection fibers of the measuring equipment.

A second aspect of the invention relates to a method for measuring the current circulating through a conductor with current measuring equipment like the one described above.

In the method of the invention, the first emitter emits a first signal which reaches the first sensing branch through the first input branch, travels along the first sensing branch and is modified depending on the current circulating through the conductor, and is received by the second receiver from the second input branch.

The second emitter emits a second signal which reaches the first sensing branch through the second input branch, travels along the first sensing branch and is modified depending on the current circulating through the conductor, and is received by the first receiver from the first input branch.

The first signal also reaches the second sensing branch through the first input branch, and the second signal also reaches the second sensing branch through the second input branch. The first signal and the second signal travel along said second sensing branch and are modified depending on the current circulating through the conductor.

The second receiver receives from the second input branch the first signal modified in the second sensing branch, the first receiver also receiving from the first input branch the second signal modified in the second sensing branch.

The current circulating through the conductor is determined by combining the first signal modified in the first sensing branch and received by the second receiver, the second signal modified in the first sensing branch and received by the first receiver, the first signal modified in the second sensing branch and received by the second receiver, and the second signal modified in the second sensing branch and received by the first receiver.

By means of these four signals, a precise calculation of the current circulating through the conductor is obtained, with a high dynamic range.

These and other advantages and features will become evident in view of the drawings and the detailed description.

DETAILED DESCRIPTION

Figure 1:
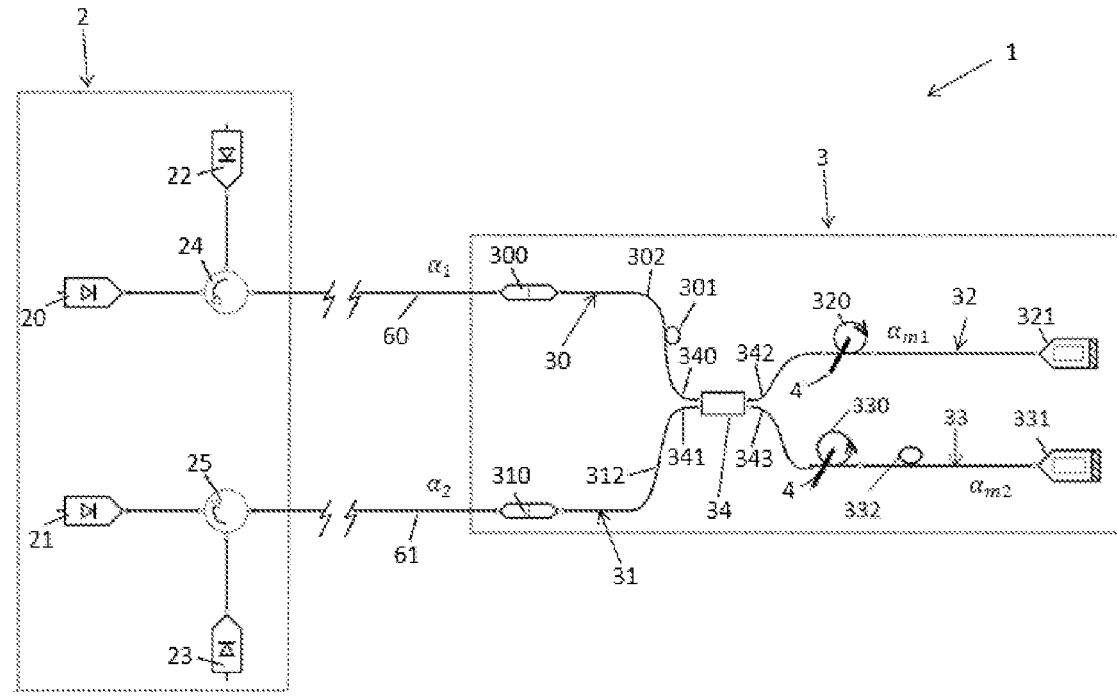
FIG. 1 schematically shows optical fiber-based current measuring equipment according to a first embodiment.

FIG. 1 shows a first embodiment of the optical fiber-based current measuring equipment 1 for measuring the current circulating through a conductor 4.

The measuring equipment 1 comprises an interrogator 2 comprising a first emitter 20 and a second emitter 21. The interrogator 2 also comprises a first receiver 22 and a second receiver 23.

Furthermore, the measuring equipment 1 comprises a sensing portion 3 connected to the interrogator 2 and configured for being arranged in the proximity of the conductor 4.

The sensing portion 3 comprises a first input branch 30 comprising a first polarizer 300 and a fiber twist 301 after said first polarizer 300. Preferably, the first polarizer 300 is a linear polarizer filtering the input signal allowing only a specific oscillation direction of the electric field of the light to go through. Preferably, the first polarizer 300 only allows the part of the signal oscillating at 0 degrees to go through. Preferably, the fiber twist 301 is a geometric rotator which is obtained by means of twisting the fiber 302 connecting the first polarizer 300 to the splitter 34.

The sensing portion 3 also comprises a second input branch 31 comprising a second polarizer 310. Preferably, said second polarizer 310 is a linear polarizer filtering the input signal allowing only a specific oscillation direction of the electric field of the light to go through. Preferably, the second polarizer 310 only allows the part of the signal oscillating at 0 degrees to go through.

The sensing portion 3 also comprises a first sensing branch 32 comprising a first optical fiber winding 320 arranged in the proximity of the conductor 4 and a first Faraday mirror 321.

Furthermore, the sensing portion 3 comprises a second sensing branch 33 comprising a second optical fiber winding 330 arranged in the proximity of the conductor 4, a second Faraday mirror 331, and a delaying element 332 between the second optical fiber winding 330 and the second Faraday mirror 331. The delaying element 332 of the second sensing branch 33 is necessary so that the first receiver 22 and the second receiver 23 can differentiate the signal received from the first sensing branch 32 from the signal received from the second sensing branch 33, i.e., it allows managing the signals received in the receivers 22 and 23 of the interrogator 2. Preferably, the delaying element 332 consists of arranging a length of additional fiber between the second optical fiber winding 330 and the second Faraday mirror 331, such that the signals circulating through said second sensing branch 33 travel along a distance greater than the distances they travel along the first sensing branch 32, the signals travelling along the second sensing branch 33 reaching the receivers 22 and 23 of the interrogator 2 with an offset with respect to the signals travelling along the first sensing branch 32. Since the mirrors 321 and 331 used for reflecting the signals of the sensing branches 32 and 33 are Faraday-type mirrors, the delaying element 332 by way of an additional fiber arranged between the second optical fiber winding 330 and the Faraday mirror 331 does not affect the measurement of the current circulating through the conductor 4. Furthermore, using Faraday mirrors causes the response of the first optical fiber winding 320 and of the second optical fiber winding 330 to stabilize, improving calculation of the current of the conductor 4.

The sensing portion 3 also comprises a splitter 34 coupling the first input branch 30 and the second input branch 31 to the first sensing branch 32 and to the second sensing branch 33.

As observed in FIG. 1, the splitter 34 of the first embodiment is a splitter 34 comprising two inputs 340 and 341 and two outputs 342 and 343. In this first embodiment, the first input branch 30 of the sensing portion 3 is connected to the first input 340 of the splitter 34, the second input branch 31 is connected to the second input 341 of the splitter 34, the first sensing branch 32 is connected to the first output 342 of the splitter 34, and the second sensing branch 33 is connected to the second output 343 of the splitter 34. When a first signal emitted by the first emitter 20 reaches the first input 340 of the splitter 34, the splitter 34 splits the power of said first signal in two, with the first signal exiting through each of the outputs 342 and 343 of the splitter 34, but with half the power. Similarly, when a second signal emitted by the second emitter 21 reaches the second input 341 of the splitter 34, the splitter 34 splits the power of said second signal in two, with the second signal exiting through each of the outputs 342 and 343 of the splitter 34, but with half the power. When a signal circulates in the opposite direction, i.e., when the first signal or the second signal modified in the first sensing branch 32 reaches the first output 342 of the splitter 34, the operation of said splitter 34 is the same, splitting the power of said modified signal in two, with the modified signal exiting through each of the inputs 340 and 341 of the splitter 34, but with half the power. Similarly, when the first signal or the second signal modified in the second sensing branch 33 reaches the second output 343 of the splitter 34, the splitter 34 splits the power of said modified signal in two, with the modified signal exiting through each of the inputs 340 and 341 of the splitter 34, but with half the power.

The first optical fiber winding 320 of the first sensing branch 32 and the second optical fiber winding 330 of the second sensing branch 33 comprise the same number of turns that are, however, wound in opposite directions. In other words, one of the optical fiber windings will be wound clockwise, whereas the other optical fiber winding will be wound anticlockwise, obtaining a sensing portion comprising two optical fiber windings of the same length but arranged opposite one another. Since the first optical fiber winding 320 and the second optical fiber winding 330 have the same length, they exhibit the same response in the deviation of light polarization, but since the windings are arranged in opposite directions, said responses are in phase opposition, i.e., they are offset by 180 degrees.

This configuration allows determining the current circulating through the conductor 4 in a very precise manner, particularly at values in which the current circulating through the conductor 4 is low and therefore the signal/noise ratio is high, given that this configuration allows for good noise cancelation without having to use filters to eliminate said noise. Likewise, obtaining good noise elimination offers very good measurements of the conductors 4 through which direct current circulates and in which filters cannot be used. Furthermore, by processing the signals obtained in the first receiver 22 and in the second receiver 23, it is possible to obtain a precise calculation of the fiber twist 301 of the first input branch 30 and of the attenuations $\alpha_1$, $\alpha_2$, $\alpha_{m1}$, and $\alpha_{m2}$ caused by the different connection fibers of the measuring equipment 1.

In this first embodiment, the interrogator 2 comprises a first circulator 24 connecting the first emitter 20 and the first receiver 22 of the interrogator 2 to the first input branch 30 of the sensing portion 3. Furthermore, in this first embodiment the first circulator 24 and the first input branch 30 of the sensing portion 3 are connected through a first intermediate fiber 60, as observed in FIG. 1. The first circulator 24 therefore couples the signal emitted by the first emitter 20 to the first input branch 30 of the sensing portion 3 through the first intermediate fiber 60. The first circulator 24 also couples the signal modified in the sensing portion 3 to the first receiver 22 through the first intermediate fiber 60.

Similarly, in this first embodiment the interrogator 2 comprises a second circulator 25 connecting the second emitter 21 and the second receiver 23 of the interrogator 2 to the second input branch 31 of the sensing portion 3. Furthermore, in this first embodiment the second circulator 25 and the second input branch 31 of the sensing portion 3 are connected through a second intermediate fiber 61, as observed in FIG. 1. The second circulator 25 therefore couples the signal emitted by the second emitter 21 to the second input branch 31 of the sensing portion 3 through the second intermediate fiber 61. The second circulator 25 also couples the signal modified in the sensing portion 3 to the second receiver 23 through the second intermediate fiber 61.

Preferably, the first intermediate fiber 60 and the second intermediate fiber 61 are standard single-mode (SM) fibers. To enable joining the interrogator 2 with the sensing portion 3 through standard single-mode type intermediate fibers 60 and 61, the concept described in patent document WO2016198575A1, belonging to the same applicant and incorporated herein by reference in its entirety, is used. Therefore, preferably both the signal emitted by the first emitter 20 and the signal emitted by the second emitter 21 is a signal made up of a set of at least two polarized light pulses, said polarized pulses having a specific difference in degrees, said difference in polarization preferably being 90 degrees. In other words, preferably the first emitter 20 and the second emitter 21 of the interrogator 2 are configured for emitting signals comprising a set of at least two polarized light pulses, said polarized pulses having a specific difference in degrees. To that end, the first emitter 20 and the second emitter 21 of the interrogator 2 can be of any type described in patent document WO2016198575A1 or of any other type known to the person skilled in the art and complying with the requirements described above.

As described in patent document WO2016198575A1, if standard single-mode fibers 60 and 61 are used for joining the interrogator 2 with the sensing portion 3, these fibers can vary the characteristics of the light signal emitted from the emitter, for example in the polarization thereof. Said intermediate fibers can modify light polarization due to different aspects, such as the temperature of said fibers, the vibrations they undergo, etc. The emission of signals made up of sets of at least two polarized light pulses, said polarized pulses having a specific difference in degrees, means that the measuring equipment can compensate for alterations in polarization caused by the intermediate fibers. The polarized light pulses of the set of pulses can be simultaneous or can be emitted within a small time interval between said pulses, given that it is thereby assured that the behavior of the intermediate fiber is the same for all the pulses of the set of pulses. Therefore, as explained in patent document WO2016198575A1, since the characteristics of the intermediate fiber do not affect current measurement, an intermediate fiber of the required length can be used. It is therefore possible to arrange the sensing portion 3 and the interrogator 2 at a distance of several kilometers without the measurement being affected by said intermediate fibers 60 and 61. The current of conductors located in remote sites can therefore be measured without having to arrange the interrogator 2 in said locations which may not comply with the requirements necessary for the operation of said interrogators, for example, or may not have a reliable power supply.

As mentioned above, the first input branch 30 of the sensing portion 3 comprises a fiber twist 301. Ideally, said fiber twist 301 is about 45 degrees. As described in European patent application EP18196585.6, belonging to the same applicant and incorporated herein by reference in its entirety, with a 45-degree rotation the quadratic terms of the signals used for calculating the current circulating through the conductor 4 are cancelled. Therefore, the sensitivity of the measuring equipment 1 is maximized, in addition to providing phase information.

In this first embodiment, the fiber 312 connecting the second polarizer 310 to the splitter 34 does not provide any rotation to the signal going through same. In other possible embodiments not shown in the drawings, the second input branch may comprise an additional fiber twist after the second polarizer, the sum of the fiber twist of the first input branch and the additional fiber twist of the second input branch preferably being about 45 degrees.

In the method of the invention applied to this first embodiment, the first emitter 20 emits a first signal which reaches the first sensing branch 32 through the first input branch 30, travels along said first sensing branch 32 and is modified depending on the current circulating through the conductor 4, and is received by the second receiver 23 from the second input branch 31. Furthermore, the second emitter 21 emits a second signal which reaches the first sensing branch 32 through the second input branch 31, travels along the first sensing branch 32 and is modified depending on the current circulating through the conductor 4, and is received by the first receiver 22 from the first input branch 30.

Moreover, said first signal emitted by the first emitter 20 also reaches the second sensing branch 33 through the first input branch 30, and said second signal emitted by the second emitter 21 also reaches the second sensing branch 33 through the second input branch 31. The first signal and the second signal travel along said second sensing branch 33 and are modified depending on the current circulating through the conductor 4. The second receiver 23 receives from the second input branch 31 the first signal modified in the second sensing branch 33, whereas the first receiver 22 receives from the first input branch 30 the second signal modified in the second sensing branch 33.

Therefore, the current circulating through the conductor 4 is determined by combining the first signal modified in the first sensing branch 32 and received by the second receiver 23, the second signal modified in the first sensing branch 32 and received by the first receiver 22, the first signal modified in the second sensing branch 33 and received by the second receiver 23, and the second signal modified in the second sensing branch 33 and received by the first receiver 22.

In the context of the invention, self signal will be considered that signal which is emitted by the first emitter 20 and received by the first receiver 22 after being reflected in the sensing portion 3, and that signal which is emitted by the second emitter 21 and received by the second receiver 23 after being reflected in the sensing portion 3. In contrast, cross signal will be considered that signal which is emitted by the first emitter 20 and received by the second receiver 23 after being reflected in the sensing portion 3, and that signal which is emitted by the second emitter 21 and received by the first receiver 22 after being reflected in the sensing portion 3.

Therefore, cross signals are used for determining the current circulating through the conductor 4, whereas self signals, which will also reach the first receiver 22 and the second receiver 23, are rejected.

In this first embodiment, the first receiver 22 and the second receiver 23 comprise a respective photodiode. As mentioned above, the first receiver 22 will receive the second signal modified in the first sensing branch 32 and in the second sensing branch 33, whereas the second receiver 23 will receive the first signal modified in the first sensing branch 32 and in the second sensing branch 33. The photodiodes convert light into intensity, such that the control unit, not shown in the drawings, can determine the current circulating through the conductor 4 by processing and combining the intensity it receives from the photodiode of the first receiver 22 and the intensity it receives from the photodiode of the second receiver 23.

On one hand, there are the two cross signals which have been modified in the first optical fiber winding 320 of the first sensing branch 32:

$$R_{12} = \alpha_{m1} P_{12} [\cos^2(2\gamma\varphi)\sin^2\theta_d + \gamma^2 \sin^2(2\gamma\varphi)\cos^2\theta_d - 2\gamma \sin(2\gamma\varphi)\cos(2\gamma\varphi)\cos\theta_d \sin\theta_d]$$

$$R_{21} = \alpha_{m1} P_{21} [\cos^2(2\gamma\varphi)\sin^2\theta_d + \gamma^2 \sin^2(2\gamma\varphi)\cos^2\theta_d + 2\gamma \sin(2\gamma\varphi)\cos(2\gamma\varphi)\cos\theta_d \sin\theta_d]$$

On the other hand, there are the two cross signals which have been modified in the second optical fiber winding 330 of the second sensing branch 33:

$$Q_{12} = \alpha_{m2} P_{12} [\cos^2(2\gamma\varphi)\sin^2\theta_d + \gamma^2 \sin^2(2\gamma\varphi)\cos^2\theta_d + 2\gamma \sin(2\gamma\varphi)\cos(2\gamma\varphi)\cos\theta_d \sin\theta_d]$$

$$Q_{21} = \alpha_{m2} P_{21} [\cos^2(2\gamma\varphi)\sin^2\theta_d + \gamma^2 \sin^2(2\gamma\varphi)\cos^2\theta_d - 2\gamma \sin(2\gamma\varphi)\cos(2\gamma\varphi)\cos\theta_d \sin\theta_d]$$

Where
- $R_{12}$=The light intensity measured by the second receiver 23 relative to the first signal modified in the first sensing branch 32.
- $R_{21}$=The light intensity measured by the first receiver 22 relative to the second signal modified in the first sensing branch 32.
- $Q_{12}$=The light intensity measured by the second receiver 23 relative to the first signal modified in the second sensing branch 33.
- $Q_{21}$=The light intensity measured by the first receiver 22 relative to the second signal modified in the second sensing branch 33.
- $\alpha_{m1}$=The attenuation of the first sensing branch 32.
- $\alpha_{m2}$=The attenuation of the second sensing branch 33.

$$P_{12} = P_1 \alpha_1 \alpha_2 R_2$$

Where:
- $P_1$=Power of the light emitted by the first emitter 20
- $\alpha_1$=Attenuation of fibers 60 and 302
- $\alpha_2$=Attenuation of fibers 312 and 61
- $R_2$=Receiving gain of the second receiver 23.

$$P_{21} = P_2 \alpha_2 \alpha_1 R_1$$

Where:
- $P_2$=Power of the light emitted by the second emitter 21
- $\alpha_1$=Attenuation of fibers 60 and 302
- $\alpha_2$=Attenuation of fibers 312 and 61
- $R_1$=Receiving gain of the first receiver 22.

$$\gamma = \frac{\left(\frac{\delta_c}{2} + \psi\right)}{\sqrt{\left(\frac{\delta_l}{2}\right)^2 + \left(\frac{\delta_c}{2} + \psi\right)^2}}$$

Where:
- $\delta_c$=circular birefringence of the fiber of optical fiber winding 320 and 330
- $\psi$=rotation of the fiber of optical fiber winding 320 and 330
- $\delta_l$=linear birefringence of the fiber of optical fiber winding 320 and 330

Since $$\delta_l < \left(\frac{\delta_c}{2} + \psi\right)$$

is always true, it means that $\gamma$ is approximately 1 in all cases.

$$\varphi = V * B * l$$

Where:
- V=Verdet constant of the optical fiber at the working wavelength
- B=the magnetic field generated by the conductor 4.
- l=the length of optical fiber winding 320 and 330.
- $\Theta_d$=The rotation provided by fiber twist 301 of the first input branch 30.

The following relations can be obtained by performing subtraction, addition, and square root operations on these equations:

$$[\sqrt{R_{21}} - \sqrt{Q_{21}}] + [\sqrt{Q_{12}} - \sqrt{R_{12}}] = \sqrt{(\alpha_{m1} + \alpha_{m2})(P_{21} + P_{12})} \sin(2\varphi)\cos\theta_d + \sqrt{(\alpha_{m1} - \alpha_{m2})(P_{21} - P_{12})} \cos(2\varphi)sen\theta_d$$

$$[\sqrt{R_{21}} - \sqrt{R_{12}}] + [\sqrt{Q_{12}} - \sqrt{Q_{21}}] = \sqrt{(\alpha_{m1} + \alpha_{m2})(P_{21} + P_{12})} \sin(2\varphi)\cos\theta_d + \sqrt{(\alpha_{m1} - \alpha_{m2})(P_{21} - P_{12})} \cos(2\varphi)sen\theta_d$$

Taking into account that:

$$\alpha_{m1} \approx \alpha_{m2} = \alpha_m$$

$$P_{12} \approx P_{21} = P$$

$$\gamma \approx 1$$

The error term has a double-zero coefficient $(\alpha_{m1}-\alpha_{m2})$ $(P_{12}-P_{21})$. Therefore, if it is assumed that $(\alpha_{m1}-\alpha_{m2})(P_{12}-P_{21})\approx 0$, the following final calculations for the signal are obtained:

$$\sin(2\gamma\varphi) = \frac{\left[\sqrt{R_{21}} - \sqrt{Q_{21}}\right] + \left[\sqrt{Q_{12}} - \sqrt{R_{12}}\right]}{\sqrt{(\alpha_{m1} + \alpha_{m2})(P_{21} + P_{12})} \cos\theta_d}$$

$$\sin(2\gamma\varphi) = \frac{\left[\sqrt{R_{21}} - \sqrt{R_{12}}\right] + \left[\sqrt{Q_{12}} - \sqrt{Q_{21}}\right]}{\sqrt{(\alpha_{m1} + \alpha_{m2})(P_{21} + P_{12})} \cos\theta_d}$$

Based on these formulas, value B relative to the magnetic field generated around the conductor 4 can be obtained, and therefore the intensity circulating through said conductor 4 can be determined in a very precise manner.

To enable performing said calculation, the $\alpha_m P$ value will be obtained from the following formulas:

$$2\alpha_m P = \frac{\left[\sqrt{R_{21}} + \sqrt{R_{12}}\right]^2}{sen^2\theta_d} + \frac{\left[\sqrt{R_{21}} - \sqrt{R_{12}}\right]^2}{\cos^2\theta_d}$$

$$2\alpha_m P = \frac{\left[\sqrt{Q_{21}} + \sqrt{Q_{12}}\right]^2}{sen^2\theta_d} + \frac{\left[\sqrt{Q_{21}} - \sqrt{Q_{12}}\right]^2}{\cos^2\theta_d}$$

$$2\alpha_m P = \frac{\left[\sqrt{R_{12}} + \sqrt{Q_{12}}\right]^2}{sen^2\theta_d} + \frac{\left[\sqrt{R_{12}} - \sqrt{Q_{12}}\right]^2}{\cos^2\theta_d}$$

$$2\alpha_m P = \frac{\left[\sqrt{R_{21}} + \sqrt{Q_{21}}\right]^2}{sen^2\theta_d} + \frac{\left[\sqrt{R_{21}} - \sqrt{Q_{21}}\right]^2}{\cos^2\theta_d}$$

As can be observed in the formulas which refer to the final calculation of the signal, the current measurement depends on the fiber twist 301. The value of the fiber twist 301 is defined in the manufacturing process, but it can undergo small variations during use of the measuring equipment 1. For this reason, if there is a need to perform a very precise calculation of the current of the conductor 4, it is advisable to gradually adapt the value of said fiber twist 301 to prevent error terms from being generated. Said value can also be calculated by means of the two cross signals which have been modified in the first optical fiber winding 320 of the first sensing branch 32.

As can be observed, quadratic terms are not seen in the equations obtained for the calculation of the current circulating through the conductor 4. This occurs as a result of the symmetrical double measurement performed, i.e., as a result of the combination of the cross signals. As described in European patent application EP18196585.6, belonging to the same applicant and incorporated herein by reference in its entirety, with the symmetry of the cross signals of each sensing branch 32 and 33, the quadratic terms of the signal are eliminated, even in conditions in which the rotation provided to the signal by the fiber twist 301 is not 45 degrees, obtaining a resulting signal which maintains the shape of the signal and therefore allows obtaining the desired information. In the case of the present invention, since the first optical fiber winding 320 and the second optical fiber winding 330 have the same length, they exhibit the same response in the deviation of light polarization, but in phase opposition. Therefore, instead of having two cross signals to perform calculation of the current like in the case of document EP18196585.6, 4 cross signals are obtained, from which a more precise calculation of the current circulating through the conductor 4 can be obtained, given that the error term has a double-zero coefficient $(\alpha_{m1}-\alpha_{m2})$ $(P_{12}-P_{21})$. Furthermore, having these four cross signals allows performing a good assessment of the attenuations of the connection fibers and the attenuations of the sensing branches, and it also allows adjusting the fiber twist 301. A very precise current measurement with a high dynamic range is thus obtained.

As mentioned above, preferably both the signal emitted by the first emitter 20 and the signal emitted by the second emitter 21 is a signal made up of a set of at least two polarized light pulses, said polarized pulses having a specific difference in degrees, said difference in polarization preferably being 90 degrees. The emission of signals of this type allows compensating for possible changes in light polarization caused by the intermediate fibers 60 and 61 joining the interrogator 2 with the sensing portion 3.

According to one embodiment, the first sensing branch includes a delaying element located between the first optical fiber winding and the first Faraday mirror, the delaying element of the first sensing branch being different from the delaying element 332 of the second sensing branch.

Figure 2:
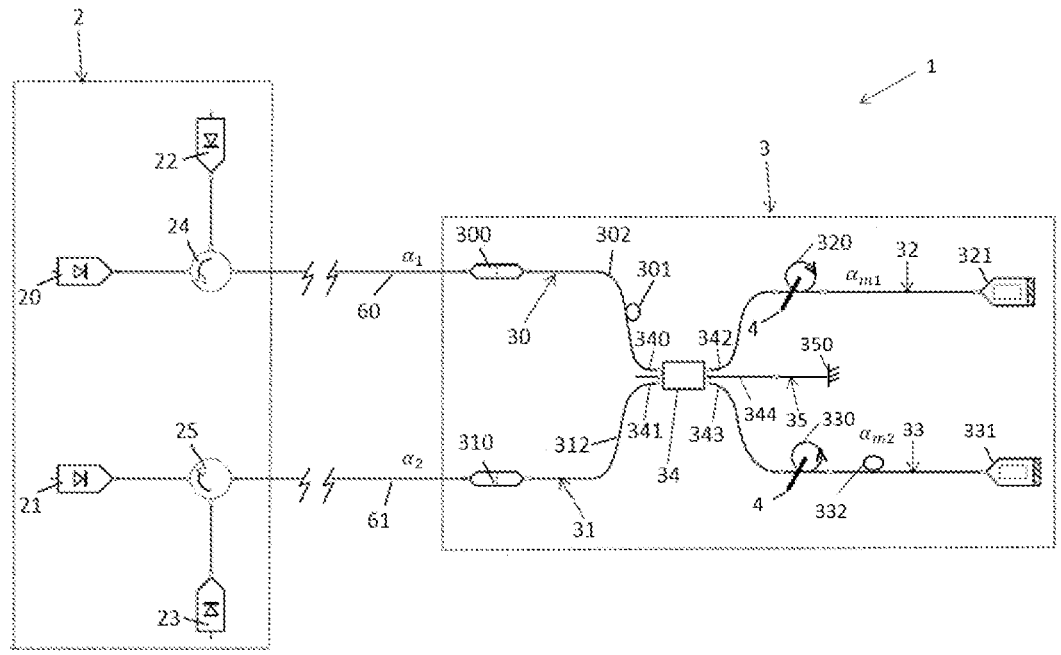
FIG. 2 schematically shows optical fiber-based current measuring equipment according to a second embodiment.

FIG. 2 shows a second embodiment of the measuring equipment 1.

The measuring equipment 1 of the second embodiment differs from the measuring equipment 1 of the first embodiment in that the sensing portion 3 also comprises an output branch 35. Said output branch 35 is coupled to the first input branch 30 and the second input branch 31 by means of the splitter 34. The rest of the configuration of the measuring equipment 1 is similar to that of the first embodiment so it is not considered necessary to describe it again.

The output branch 35 of this second embodiment is configured for returning the same signal it receives to the splitter 34. Therefore, signals from the first input branch 30 and the second input branch 31 reach the output branch 35 through the splitter 34, are reflected in the output branch 35, and return to the first input branch 30 and the second input branch 31 through the splitter 34. The signals reflected in the output branch 35 and received in the first receiver 22 and second receiver 23 allow adjusting some parameters required for performing a precise calculation of the current circulating through the conductor 4 in a more direct manner than by adjusting said values using only the cross signals of the first sensing branch 32 and the second sensing branch 33.

Therefore, the output branch 35 offers additional information for an even better adjustment of the different parameters when calculating the current circulating through the conductor 4, improving the dynamic range of the measuring equipment 1.

For the output branch 35 to reflect/return the same signal it receives, one of the options would simply be to make a "clean" cut on the actual corresponding output terminal 344 of the splitter, such that said cut would cause the signal to rebound in the output terminal 343 due to the sudden change in the refractive index which said cut would cause. Another option would be to place a conventional mirror 350, as shown in FIG. 2. In other possible embodiments, the signal can be returned in any other way known to the person skilled in the art, provided that the signal returned by the output branch is the same as the one received by said output branch.

In the embodiments in which the measuring equipment comprises an output branch in addition to the two sensing branches, it may be necessary for the first sensing branch to comprise a delaying element between the first optical fiber winding and the first Faraday mirror, the delaying element of first the sensing branch and the delaying element of the second sensing branch being different from one another to enable the receivers of the interrogator to manage the signals from the sensing branches and the output branch. In any case, the delaying element between the first optical fiber winding 320 and the first Faraday mirror 321 is dispensable if the fiber with which said first optical fiber winding 320 is made is long enough so as to delay the signals travelling along said first sensing branch 32 as much as possible so that the receivers 22 and 23 of the interrogator 2 can manage the signals from the two sensing branches 23 and 33 and the output branch 35, as shown in the embodiment of FIG. 2.

In the method of the invention applied to this second embodiment, the first emitter 20 emits a first signal which reaches the first sensing branch 32 through the first input branch 30, travels along said first sensing branch 32 and is modified depending on the current circulating through the conductor 4, and is received by the second receiver 23 from the second input branch 31. Furthermore, the second emitter 21 emits a second signal which reaches the first sensing branch 32 through the second input branch 31, travels along the first sensing branch 32 and is modified depending on the current circulating through the conductor 4, and is received by the first receiver 22 from the first input branch 30.

Moreover, said first signal emitted by the first emitter 20 also reaches the second sensing branch 33 through the first input branch 30, and said second signal emitted by the second emitter 21 also reaches the second sensing branch 33 through the second input branch 31. The first signal and the second signal travel along said second sensing branch 33 and are modified depending on the current circulating through the conductor 4. The second receiver 23 receives from the second input branch 31 the first signal modified in the second sensing branch 33, whereas the first receiver 22 receives from the first input branch 30 the second signal modified in the second sensing branch 33.

Furthermore, the signal emitted by the first emitter 20 reaches the output branch 35 through the first input branch 30, is reflected in said output branch 35, and is received by the first receiver 22 from the first input branch 30 and by the second receiver 23 from the second input branch 31, and the signal emitted by the second emitter 21 reaches the output branch 35 through the second input branch 31, is reflected in said output branch 35, and is received by the first receiver 22 from the first input branch 30 and by the second receiver 23 from the second input branch 31.

Like in the method applied to the first embodiment, the current circulating through the conductor 4 is determined by combining the first signal modified in the first sensing branch 32 and received by the second receiver 23, the second signal modified in the first sensing branch 32 and received by the first receiver 22, the first signal modified in the second sensing branch 33 and received by the second receiver 23, and the second signal modified in the second sensing branch 33 and received by the first receiver 22.

This case involves the signals reflected in the output branch 35 in addition to the cross signals described in the first embodiment. In the case of the signals reflected in the output branch 35, both self signals and cross signals are used. These signals offer additional information for an even better adjustment of the different parameters while calculating the current, improving the dynamic range of the measuring equipment 1.

Specifically, these signals can be used for adjusting variations in the fiber twist 301 through the following formula:

$$\theta_d = \mathrm{acos} \sqrt[4]{\frac{E_{12} * E_{21}}{E_{11} * E_{22}}}$$

Where
$E_{11}$=The light intensity measured by the first receiver 22 relative to the first signal reflected in the output branch 35.
$E_{12}$=The light intensity measured by the second receiver 23 relative to the first signal reflected in the output branch 35.
$E_{22}$=The light intensity measured by the second receiver 23 relative to the second signal reflected in the output branch 35.
$E_{21}$=The light intensity measured by the first receiver 22 relative to the second signal reflected in the output branch 35.

The signals reflected in the output branch 35 can also be used for determining the attenuations $\alpha_1$, $\alpha_2$, $\alpha_{m1}$, and $\alpha_{m2}$ caused by the different fibers of the measuring equipment 1.

Figure 3:
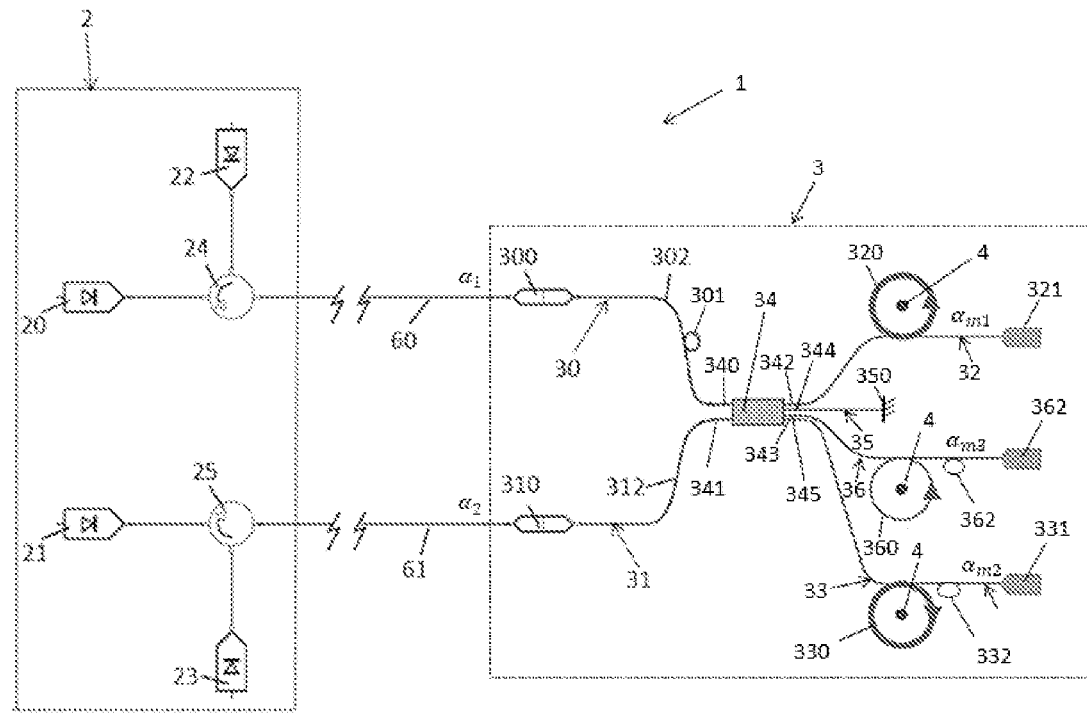
FIG. 3 schematically shows optical fiber-based current measuring equipment according to a third embodiment.

FIG. 3 shows a third embodiment of the measuring equipment 1.

The measuring equipment 1 of the third embodiment differs from the measuring equipment 1 of the second embodiment in that the sensing portion 3 comprises an additional sensing branch. Said additional sensing branch is a third sensing branch 36 which is coupled to the first input branch 30 and the second input branch 31 by means of the splitter 34. The rest of the configuration of the measuring equipment 1 is similar to that of the second embodiment so it is not considered necessary to describe it again.

The third sensing branch 36 comprises a third optical fiber winding 360 and a third Faraday mirror 362 located after the third optical fiber winding 360. The third optical fiber winding 360 is configured to be positioned adjacent the conductor 4. The third optical winding comprises a number of turns that is less than the number of turns of the first optical fiber winding 320 and the second optical fiber winding 330.

As it has being explained before, the configuration of the first and second embodiment allows determining the current circulating through the conductor 4 in a very precise manner, particularly at values in which the current circulating through the conductor 4 is low and therefore the signal/noise ratio is high. To determine such low currents it is necessary for the first optical fiber winding 320 and the second optical fiber winding 330 to comprise many turns. However, with said number of turns, when a high current circulates through the conductor 4, for example an overcurrent due to a short circuit, the determination of said current obtained with the configuration of the first and the second embodiment is not precise because in said situation the signals modified in the first sensing branch 32 and in the second sensing branch 33 are not easy to manage. A high current or short circuit current may be, for example, a current greater than 1,500 amps. The configuration of this third embodiment solves this problem adding the third sensing branch 36 with a third optical fiber winding 360 comprising less number of turns than the number of turns of the first optical fiber winding 320 and the second optical fiber winding 330. In one example, the first optical fiber winding 320 and the second optical fiber winding 330 comprise 200 turns, whereas the third optical fiber winding 360 comprises 5 turns.

Said third sensing branch 36 allows determining the current circulation through the conductor 4 when a high current circulates through said conductor 4. In order to obtain a precise determination it is not necessary to have another sensing branch comprising an optical fiber winding with the same number of turns that the third optical fiber winding but wound in opposite directions because, as it has being explained before, the attenuations $\alpha_1$, $\alpha_2$, and $\alpha_{m2}$ can be calculated using the signals modified in the first sensing branch 32, the second sensing branch 33 and the output branch 35. Moreover, as said attenuation $\alpha_1$, $\alpha_2$, $\alpha_{m1}$, and $\alpha_{m2}$ are already known, the attenuation $\alpha_{m3}$ of the third sensing branch 36 can also be obtained. This way, when the current circulating through the conductor 4 is determined using the third sensing branch 36, said parameters $\alpha_1$, $\alpha_2$, $\alpha_{m1}$, $\alpha_{m2}$ and $\alpha_{m3}$ are used to obtain a precise determination of the current.

The third sensing branch 36 includes a third delaying element 362 located between the third optical fiber winding 360 and the third Faraday mirror 362. According to one embodiment, the delaying elements 332 and 632 are different from one another.

According to one embodiment, the first sensing branch also includes a delaying element located between the first optical fiber winding and the first Faraday mirror, the delaying elements of the first, second and third sensing branches being different from one another.

In the method of the invention applied to this third embodiment, the first emitter 20 emits a first signal which reaches the first sensing branch 32 through the first input branch 30, travels along said first sensing branch 32 and is modified depending on the current circulating through the conductor 4, and is received by the second receiver 23 from the second input branch 31. Furthermore, the second emitter 21 emits a second signal which reaches the first sensing branch 32 through the second input branch 31, travels along the first sensing branch 32 and is modified depending on the current circulating through the conductor 4, and is received by the first receiver 22 from the first input branch 30.

Moreover, said first signal emitted by the first emitter 20 also reaches the second sensing branch 33 through the first input branch 30, and said second signal emitted by the second emitter 21 also reaches the second sensing branch 33 through the second input branch 31. The first signal and the second signal travel along said second sensing branch 33 and are modified depending on the current circulating through the conductor 4. The second receiver 23 receives from the second input branch 31 the first signal modified in the second sensing branch 33, whereas the first receiver 22 receives from the first input branch 30 the second signal modified in the second sensing branch 33.

Additionally, said first signal emitted by the first emitter 20 also reaches the third sensing branch 36 through the first input branch 30, and said second signal emitted by the second emitter 21 also reaches the third sensing branch 36 through the second input branch 31. The first signal and the second signal travel along said third sensing branch 36 and are modified depending on the current circulating through the conductor 4. The second receiver 23 receives from the second input branch 31 the first signal modified in the third sensing branch 36, whereas the first receiver 22 receives from the first input branch 30 the second signal modified in the third sensing branch 36.

Furthermore, the signal emitted by the first emitter 20 reaches the output branch 35 through the first input branch 30, is reflected in said output branch 35, and is received by the first receiver 22 from the first input branch 30 and by the second receiver 23 from the second input branch 31, and the signal emitted by the second emitter 21 reaches the output branch 35 through the second input branch 31, is reflected in said output branch 35, and is received by the first receiver 22 from the first input branch 30 and by the second receiver 23 from the second input branch 31.

The current circulating through the conductor 4 is determined as explained for the first embodiment by combining the first signal modified in the first sensing branch 32 and received by the second receiver 23, the second signal modified in the first sensing branch 32 and received by the first receiver 22, the first signal modified in the second sensing branch 33 and received by the second receiver 23, and the second signal modified in the second sensing branch 33 and received by the first receiver 22.

However, if when the current circulating through the conductor is high, said current is determined by combining the first signal modified in the third sensing branch 36 and received by the second receiver 23, the second signal modified in the third sensing branch 36 and received by the first receiver 22

With the configuration of this third embodiment precise determination of the current circulating through the conductor 4 can be obtained in a current range between 1 Ampere and 100.000 Amperes.

In another possible embodiments, not shown in the figures, the sensing portion can comprise a plurality of additional sensing branches, each of said plurality of sensing branches comprising an optical fiber winding and a Faraday mirror located after the optical fiber winding, each of said optical winding of the additional sensing branches comprising a number of turns different to the number of turns of the rest of the optical fiber windings. In this case, as explained of the third embodiment, the different attenuations caused by the first and second intermediate fibers and the additional sensing branches, and the variations in the fiber twist obtained by the signals modified in the first sensing branch, the second sensing branch and the sensing branch are used to obtain a precise determination of the current.

Figure 4:
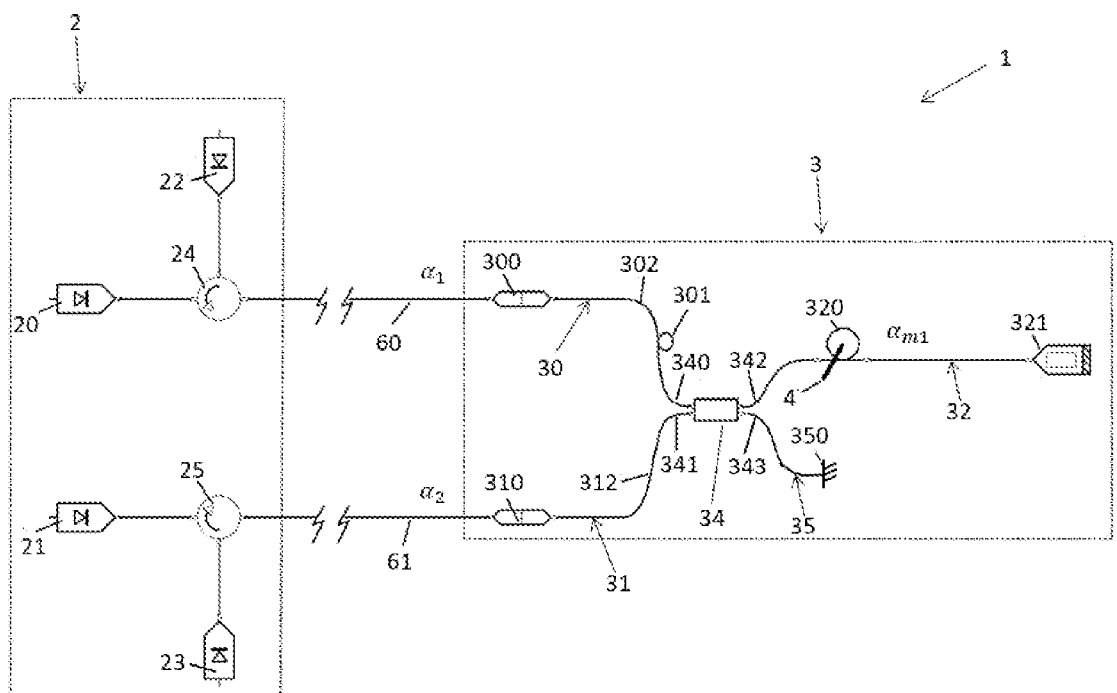
FIG. 4 schematically shows optical fiber-based current measuring equipment according to a fourth embodiment.

FIG. 4 shows a fourth embodiment of the measuring equipment 1.

The measuring equipment 1 of the fourth embodiment comprises an interrogator 2 comprising a first emitter 20 and a second emitter 21. The interrogator 2 also comprises a first receiver 22 and a second receiver 23.

Furthermore, the measuring equipment 1 of the fourth embodiment comprises a sensing portion 3 connected to the interrogator 2 and configured for being arranged in the proximity of the conductor 4.

The sensing portion 3 of this fourth embodiment comprises a first input branch 30 comprising a first polarizer 300 and a fiber twist 301 after said first polarizer 300, and a second input branch 31 comprising a second polarizer 310. The sensing portion 3 also comprises at least a first sensing branch 32 comprising a sensing section arranged in the proximity of the conductor 4 and a first Faraday mirror 321. Preferably, the sensing section of the sensing branch 32 is an optical fiber winding 320 arranged around the conductor 4, as shown in FIG. 4. In other possible embodiments not shown in the drawings, the sensing section can be made in other ways known to the person skilled in the art.

In other possible embodiments not shown in the drawings, it may be necessary to arrange a delaying element between the first optical fiber winding and the first Faraday mirror if the fiber with which said first optical fiber winding is made is not long enough so as to delay the signals travelling along the first sensing branch as much as possible to enable the receivers of the interrogator to manage the signals from the sensing branch and the output branch.

The first input branch 30 and the second input branch 31 are coupled to the sensing branch 32 by means of a splitter 34.

The sensing portion 3 of the fourth embodiment also comprises an output branch 35 coupled to the first input branch 30 and the second input branch 31 by means of the splitter 34, said output branch 35 being configured for returning the same signal it receives to the splitter 34. The output branch 35 of this configuration would be similar to the output branch 35 of the second embodiment shown in FIG. 2 described above.

This fourth embodiment of the measuring equipment 1 allows obtaining a precise current measurement. On one hand, having a first input branch 30 and a second input branch 31 allows performing a symmetrical reading in which, by combining the cross signals modified in the first sensing branch 32, the quadratic terms of the signal are annulled, as explained in application EP18196585.6. On the other hand, the output branch 35 offers additional information for adjusting the fiber twist 301 and the attenuations $\alpha_1$, $\alpha_2$, and $\alpha_{m1}$ caused by the different connection fibers of the measuring equipment 1, improving the dynamic range of the measuring equipment 1.

In the method of the invention applied to this fourth embodiment, the first emitter 20 emits a first signal which reaches the first sensing branch 32 through the first input branch 30, travels along said first sensing branch 32 and is modified depending on the current circulating through the conductor 4, and is received by the second receiver 23 from the second input branch 31. Furthermore, the second emitter 21 emits a second signal which reaches the first sensing branch 32 through the second input branch 31, travels along the first sensing branch 32 and is modified depending on the current circulating through the conductor 4, and is received by the first receiver 22 from the first input branch 30.

Furthermore, the signal emitted by the first emitter 20 reaches the output branch 35 through the first input branch 30, is reflected in said output branch 35, and is received by the first receiver 22 from the first input branch 30 and by the second receiver 23 from the second input branch 31, and the signal emitted by the second emitter 21 reaches the output branch 35 through the second input branch 31, is reflected in the conventional mirror 350, and is received by the first receiver 22 from the first input branch 30 and by the second receiver 23 from the second input branch 31.

The current circulating through the conductor 4 is determined by combining the first signal modified in the first sensing branch 32 and received by the second receiver 23 and the second signal modified in the first sensing branch 32 and received by the first receiver 22. The signals reflected in the output branch 35 offer additional information for adjusting the different parameters while calculating the current, improving the dynamic range of the measuring equipment 1.

The following clauses represent additional embodiments.

Clause 1. Optical fiber-based measuring equipment for measuring the current circulating through at least one conductor 4, the measuring equipment 1 comprising
an interrogator 2 comprising a first emitter 20, a second emitter 21, a first receiver 22, and a second receiver 23, and
a sensing portion 3 connected to the interrogator 2 and configured for being arranged in the proximity of the conductor 4, the sensing portion 3 comprising
a first input branch 30 comprising a first polarizer 300 and a fiber twist 301 after said first polarizer 300,
a second input branch 31 comprising a second polarizer 310,
a first sensing branch 32 comprising a first optical fiber winding 320 configured for being arranged in the proximity of the conductor 4 and a first Faraday mirror 321, and
a second sensing branch 33 comprising a second optical fiber winding 330 configured for being arranged in the proximity of the conductor 4, a second Faraday mirror 331, and a delaying element 332 between the second optical fiber winding 330 and the second Faraday mirror 331,
the first input branch 30 and the second input branch 31 being coupled to the first sensing branch 32 and to the second sensing branch 33 by means of a splitter 34,
the first optical fiber winding 320 and the second optical fiber winding 330 comprise the same number of turns that are, however, wound in opposite directions.

Clause 2. Measuring equipment according to clause 1, comprising an output branch 35 coupled to the first input branch 30 and the second input branch 31 by means of the splitter 34, said output branch 35 being configured for returning the same signal it receives to the splitter 34.

Clause 3. Measuring equipment according to clause 2, wherein the output branch 35 comprises a conventional mirror 350.

Clause 4. Measuring equipment according to clause 2 or 3, wherein the first sensing branch 32 comprises a delaying element between the first optical fiber winding 320 and the first Faraday mirror 321, the delaying element of first the sensing branch 32 and the delaying element 332 of the second sensing branch 33 being different from one another.

Clause 5. Measuring equipment according to any of the preceding clauses, wherein the fiber twist 301 of the first input branch 30 is about 45 degrees.

Clause 6. Measuring equipment according to any of clauses 1 to 4, wherein the second input branch 31 comprises an additional fiber twist after the second polarizer 310, the sum of the fiber twist 301 of the first input branch 30 and the additional fiber twist of the second input branch 31 preferably being about 45 degrees.

Clause 7. Method for measuring the current circulating through at least one conductor 4 with optical fiber-based measuring equipment 1, the measuring equipment 1 comprising
an interrogator 2 comprising a first emitter 20, a second emitter 21, a first receiver 22, and a second receiver 23, and
a sensing portion 3 connected to the interrogator 2 and configured for being arranged in the proximity of the conductor 4, the sensing portion 3 comprising
a first input branch 30 comprising a first polarizer 300 and a fiber twist 301 after said first polarizer 300,
a second input branch 31 comprising a second polarizer 310,
a first sensing branch 32 comprising a first optical fiber winding 320 arranged in the proximity of the conductor 4 and a first Faraday mirror 321, and
a second sensing branch 33 comprising a second optical fiber winding 330 arranged in the proximity of the conductor 4, a second Faraday mirror 331, and a delaying element 332 between the second optical fiber winding 330 and the second Faraday mirror 331,
the first input branch 30 and the second input branch 31 being coupled to the first sensing branch 32 and to the second sensing branch 33 by means of a splitter 34, and
the first optical fiber winding 320 and the second optical fiber winding 330 comprising the same number of turns that are, however, wound in opposite directions, in the method
the first emitter 20 emits a first signal which reaches the first sensing branch 32 through the first input branch 30, travels along the first sensing branch 32 and is modified depending on the current circulating through the conductor 4, and is received by the second receiver 23 from the second input branch 31, the second emitter 21 emits a second signal which reaches the first sensing branch 32 through the second input branch 31, travels along the first sensing branch 32 and is modified depending on the current circulating through the conductor 4, and is received by the first receiver 22 from the first input branch 30, the first signal also reaches the second sensing branch 33 through the first input branch 30, and the second signal also reaches the second sensing branch 33 through the second input branch 31, the first signal and the second signal travel along said second sensing branch 33 and are modified depending on the current circulating through the conductor 4, and the second receiver 23 receives from the second input branch 31 the first signal modified in the second sensing branch 33, the first receiver 22 also receiving from the first input branch 30 the second signal modified in the second sensing branch 33, the current circulating through the conductor 4 being determined by combining the first signal modified in the first sensing branch 32 and received by the second receiver 23, the second signal modified in the first sensing branch 32 and received by the first receiver 22, the first signal modified in the second sensing branch 33 and received by the second receiver 23, and the second signal modified in the second sensing branch 33 and received by the first receiver 22.

Clause 8. Method according to clause 7, wherein the sensing portion 3 comprises an output branch 35 configured for returning the same signal it receives, the first input branch 30 and the second input branch 31 also being coupled to the output branch 35 by means of a splitter 34, wherein
the signal emitted by the first emitter 20 reaches the output branch 35 through the first input branch 30, is reflected in said output branch 35, and is received by the first receiver 22 from the first input branch 30 and by the second receiver 23 from the second input branch 31, and the signal emitted by the second emitter 21 reaches the output branch 35 through the second input branch 31, is reflected in the conventional mirror 350, and is received by the first receiver 22 from the first input branch 30 and by the second receiver 23 from the second input branch 31, the signals reflected in the output branch 35 being used to enable continuously adjusting the value of the fiber twist 301.

Clause 9. Optical fiber-based measuring equipment for measuring the current circulating through at least one conductor 4, the measuring equipment 1 comprising
an interrogator 2 comprising a first emitter 20, a second emitter 21, a first receiver 22, and a second receiver 23, and
a sensing portion 3 connected to the interrogator 2 and configured for being arranged in the proximity of the conductor 4, the sensing portion 3 comprising
a first input branch 30 comprising a first polarizer 300 and a fiber twist 301 after said first polarizer 300,
a second input branch 31 comprising a second polarizer 310, and
at least one sensing branch 32 comprising a sensing section arranged in the proximity of the conductor 4 and a Faraday mirror 321,
the first input branch 30 and the second input branch 31 being coupled to the sensing branch 32 by means of a splitter 34,
the sensing portion 3 also comprises
an output branch 35 coupled to the first input branch 30 and the second input branch 31 by means of the splitter 34, said output branch 35 being configured for returning the same signal it receives to the splitter 34.

Clause 10. Measuring equipment according to clause 9, wherein the output branch 35 comprises a conventional mirror 350.

Clause 11. Measuring equipment according to clause 9 or 10, wherein the sensing section of the sensing branch 32 is an optical fiber winding 320 arranged around the conductor 4.

Clause 12. Measuring equipment according to clause 11, wherein the sensing portion 3 comprises a second sensing branch 33 comprising a second sensing section arranged in the proximity of the conductor 4, a second Faraday mirror 331, and a delaying element 332 between the second sensing section and the second Faraday mirror 331, the first input branch 30 and the second input branch 31 being coupled to the second sensing branch 33 by means of the splitter 34, the second sensing section of the second sensing branch 33 being a second optical fiber winding 330 arranged around the conductor 4, the optical fiber winding 320 of the sensing section and the second optical fiber winding 330 of the second sensing section comprising the same number of turns that are, however, wound in opposite directions.

Clause 13. Method for measuring the current circulating through at least one conductor 4 with optical fiber-based measuring equipment 1, the measuring equipment 1 comprising
an interrogator 2 comprising a first emitter 20, a second emitter 21, a first receiver 22, and a second receiver 23, and
a sensing portion 3 connected to the interrogator 2 and configured for being arranged in the proximity of the conductor 4, the sensing portion 3 comprising
a first input branch 30 comprising a first polarizer 300 and a fiber twist 301 after said first polarizer 300,
a second input branch 31 comprising a second polarizer 310,
at least one sensing branch 32 comprising a sensing section arranged in the proximity of the conductor 4 and a Faraday mirror 321, and
an output branch 35 configured for returning the same signal it receives,
the first input branch 30 and the second input branch 31 being coupled to the sensing branch 32 and to the output branch 35 by means of a splitter 34,
in the method
the first emitter 20 emits a first signal which reaches the sensing branch 32 through the first input branch 30, travels along the sensing branch 32 and is modified depending on the current circulating through the conductor 4, and is received by the second receiver 23 from the second input branch 31, the second emitter 21 emits a second signal which reaches the sensing branch 32 through the second input branch 31, travels along the sensing branch 32 and is modified depending on the current circulating through the conductor 4, and is received by the first receiver 22 from the first input branch 30, wherein the signal emitted by the first emitter 20 reaches the output branch 35 through the first input branch 30, is reflected in said output branch 35, and is received by the first receiver 22 from the first input branch 30 and by the second receiver 23 from the second input branch 31, and the signal emitted by the second emitter 21 reaches the output branch 35 through the second input branch 31, is reflected in the output branch 35, and is received by the first receiver 22 from the first input branch 30 and by the second receiver 23 from the second input branch 31, the current circulating through the conductor 4 being determined by combining the first signal modified in the sensing branch 32 and received by the second receiver 23, and the second signal modified in the sensing branch 32 and received by the first receiver 22, the signals reflected in the output branch 35 being used to enable continuously adjusting the value of the fiber twist 301 and/or the attenuations $\alpha_1$, $\alpha_2$, $\alpha_{m1}$, and $\alpha_{m2}$ caused by the different connection fibers of the measuring equipment 1.

Clause 14. Method according to clause 13, wherein the sensing section is an optical fiber winding 320 arranged around the conductor 4.

Clause 15. Method according to clause 14, wherein the sensing portion 3 comprises a second sensing branch 33 comprising a second sensing section arranged in the proximity of the conductor 4, a second Faraday mirror 331, and a delaying element 332 between the second sensing section and the second Faraday mirror 331, the first branch 30 and the second branch 31 being coupled to the second sensing branch 33 by means of a splitter 34, the second sensing section being a second optical fiber winding 330 arranged around the conductor 4, the optical fiber winding 320 of the sensing section and the second optical fiber winding 330 of the second sensing section comprising the same number of turns that are, however, wound in opposite directions, wherein the first signal also reaches the second sensing branch 33 through the first input branch 30, and the second signal also reaches the second sensing branch 33 through the second input branch 31, the first signal and the second signal travel along said second sensing branch 33 and are modified depending on the current circulating through the conductor 4, and the second receiver 23 receives from the second input branch 31 the first signal modified in the second sensing branch 33, the first receiver 22 also receiving from the first input branch 30 the second signal modified in the second sensing branch 33, the current circulating through the conductor 4 being determined by combining the first signal modified in the sensing branch 32 and received by the second receiver 23, the second signal modified in the sensing branch 32 and received by the first receiver 22, the first signal modified in the second sensing branch 33 and received by the second receiver 23, the second signal modified in the second sensing branch 33 and received by the first receiver 22.

What is claimed is:

1. An optical fiber-based measuring system for measuring a current circulating through a conductor, the optical fiber-based measuring system comprising:

an interrogator including a first emitter, a second emitter, a first receiver, and a second receiver, the first and second emitters respectively configured to emit a first light pulse and a second light pulse;

a sensing portion optically coupled to the interrogator and configured for being arranged in proximity to the conductor, the sensing portion including:

a first input branch configured to be optically coupled to the first emitter, the first input branch including a first polarizer and a first fiber twist after the first polarizer;

a second input branch configured to be optically coupled to the second emitter, the second input branch including a second polarizer;

a splitter including first and second inputs and first and second outputs, the first and second input branches being respectively optically coupled to the first and second inputs;

a first sensing branch optically coupled to the first output of the splitter and including a first optical fiber winding and a first Faraday mirror located after the first optical fiber winding, the first optical fiber winding configured to be positioned adjacent the conductor and having a first number of turns, and wound in a first direction; and a second sensing branch optically coupled to the second output of the splitter and including a second optical fiber winding and a second Faraday mirror located after the second optical fiber winding, the second optical fiber configured to be positioned adjacent the conductor and having a second number of turns that is the same as the first number of turns, and wound in a second direction opposite the first direction.

2. The optical fiber-based measuring system according to claim 1, wherein the first direction is a clockwise direction and the second direction is a counter-clockwise direction.

3. The optical fiber-based measuring system according to claim 1, further comprising an output branch optically coupled to the first and second input branches by the splitter, the output branch being configured to receive a light signal from the splitter and to return the same light signal to the splitter.

4. The optical fiber-based measuring system according to claim 3, wherein the output branch includes a conventional mirror.

5. The optical fiber-based measuring system according to claim 3, wherein the first sensing branch includes a first delaying element located between the first optical fiber winding and the first Faraday mirror, and the second sensing branch includes a second delaying element located between the second optical fiber winding and the second Faraday mirror, the first and second delaying elements being different from one another.

6. The optical fiber-based measuring system according to claim 1, wherein the second sensing branch includes a second delaying element located between the second optical fiber winding and the second Faraday mirror.

7. The optical fiber-based measuring system according to claim 1, further comprising a third sensing branch optically coupled to the first and second input branches by the splitter, the third sensing branch comprising a third optical fiber winding and a third Faraday mirror located after the third optical fiber winding, the third optical fiber winding being configured to be positioned adjacent the conductor and having a third number of turns that is less than the first number of turns.

8. The optical fiber-based measuring system according to claim 7, further comprising an output branch optically coupled to the first and second input branches by the splitter, the output branch being configured to receive a light signal from the splitter and to return the same light signal to the splitter.

9. The optical fiber-based measuring system according to claim 7, wherein the first sensing branch includes a first delaying element located between the first optical fiber winding and the first Faraday mirror, and the second sensing branch includes a second delaying element located between the second optical fiber winding and the second Faraday mirror, the third sensing branch includes a third delaying element located between the third optical fiber winding and the third Faraday mirror, the first, the second and the third delaying elements being different from one another.

10. The optical fiber-based measuring system according to claim 1, wherein the first fiber twist of the first input branch is 45 degrees.

11. The optical fiber-based measuring system according to claim 1, wherein the second input branch includes a second fiber twist after the second polarizer, a sum of the first fiber twist and the second fiber twist being 45 degrees.

12. The optical fiber-based measuring system according to claim 1, further comprising first and second circulators, the first circulator optically coupled to each of the first emitter and first receiver, the second circulator optically coupled to each of the second emitter and second receiver.

13. A method for measuring a current circulating through a conductor with an optical fiber-based measuring system, the measuring system including:
an interrogator including a first emitter, a second emitter, a first receiver, and a second receiver, the first and second emitters respectively configured to emit first and second light pulses;
a sensing portion optically coupled to the interrogator and configured to be arranged in proximity to the conductor, the sensing portion including:
a first input branch optically coupled to the first emitter, the first input branch including a first polarizer and a fiber twist located after the first polarizer;
a second input branch optically coupled to the second emitter, the second input branch including a second polarizer;
a splitter including first and second inputs and first and second outputs, the first and second input branches being respectively optically coupled to the first and second inputs;
a first sensing branch optically coupled to the first output of the splitter and including a first optical fiber winding and a first Faraday mirror located after the first optical fiber winding, the first optical fiber winding configured to be positioned adjacent the conductor and having a first number of turns, and wound in a first direction; and
a second sensing branch optically coupled to the second output of the splitter and including a second optical fiber winding, a second Faraday mirror located after the second optical fiber winding and a delaying element located between the second optical fiber winding and the second Faraday mirror, the second optical fiber configured to be positioned adjacent the conductor and having a second number of turns that is the same as the first number of turns, and wound in a second direction opposite the first direction the method comprising:
emitting a first light pulse from the first emitter, a first portion of the first light pulse reaches the first sensing branch through the first input branch and the splitter, travels along the first sensing branch through the first optical fiber winding and is modified depending on the current circulating through the conductor, a modified first portion of the first light pulse being received in the second receiver from the second input branch, a second portion of the first light pulse also reaches the second sensing branch through the first input branch and the splitter, travels along the second sensing branch through the second optical fiber winding and is modified depending on the current circulating through the conductor, a modified second portion of the first light pulse being received by the second receiver from the second input branch;
emitting a second light pulse from the second emitter, a first portion of the second light pulse reaches the first sensing branch through the second input branch and the splitter, travels along the first sensing branch through the first optical fiber winding and is modified depending on the current circulating through the conductor, a modified first portion of the second light pulse being received by the first receiver from the first input branch, a second portion of the second light pulse reaches the second sensing branch through the second input branch and splitter, travels along the second sensing branch through the second optical fiber winding and is modified depending on the current circulating through the conductor, a modified second portion of the second light pulse being received by the first receiver from the first input branch;
the current circulating through the conductor being determined by combining the modified first portion of the first light pulse modified in the first sensing branch and received by the second receiver, the modified first portion of the second light pulse modified in the first sensing branch and received by the first receiver, the modified second portion of the first light pulse modified in the second sensing branch and received by the second receiver, and the modified second portion of the second light pulse modified in the second sensing branch and received by the first receiver.

14. The method according to claim 13, wherein the sensing portion further comprises an output branch coupled to the first input branch and the second input branch by the splitter, the output branch comprising a conventional mirror, the method further comprising:
receiving in the output branch a portion of the first light pulse and reflecting the portion of the first light pulse back to the splitter so that the portion of the first light pulse is received in the first receiver through the first input branch and is received in the second receiver through the second input branch;
receiving in the output branch a portion of the second light pulse and reflecting the portion of the second light pulse back to the splitter so that the portion of the second light pulse is received in the second receiver through the second input branch and is received in the first receiver through the first input branch;

adjusting a value of the fiber twist in the first input branch based on the portion of the first light pulse and the portion of the second light pulse reflected in the output branch.

15. The method according to claim 13, wherein the sensing portion further comprises a third sensing branch optically coupled to the first and second input branches by the splitter, the third sensing branch comprising a third optical fiber winding and a third Faraday mirror located after the third optical fiber winding, the third optical fiber being configured to be positioned adjacent the conductor and having a third number of turns that is less than the first number of turns, the method further comprising:
  receiving in the third sensing branch a third portion of the first light pulse, travels along the third sensing branch through the third optical fiber winding and is modified depending on the current circulating through the conductor, a modified third portion of the first light pulse being received by the second receiver from the second input branch;
  receiving in the third sensing branch a third portion of the second light pulse, travels along the third sensing branch through the third optical fiber winding and is modified depending on the current circulating through the conductor, a modified third portion of the second light pulse being received by the first receiver from the first input branch;
  upon a high current circulating through the conductor, said high current being determined by combining the modified third portion of the first light pulse modified in the third sensing branch and received by the second receiver, the modified third portion of the second light pulse modified in the third sensing branch and received by the first receiver.

16. The method according to claim 14, wherein the sensing portion further comprises a third sensing branch optically coupled to the first and second input branches by the splitter, the third sensing branch comprising a third optical fiber winding and a third Faraday mirror located after the third optical fiber winding, the third optical fiber being configured to be positioned adjacent the conductor and having a third number of turns that is less than the first number of turns, the method further comprising:
  receiving in the third sensing branch a third portion of the first light pulse, travels along the third sensing branch through the third optical fiber winding and is modified depending on the current circulating through the conductor, a modified third portion of the first light pulse being received by the second receiver from the second input branch;
  receiving in the third sensing branch a third portion of the second light pulse, travels along the third sensing branch through the third optical fiber winding and is modified depending on the current circulating through the conductor, a modified third portion of the second light pulse being received by the first receiver from the first input branch;
  upon a high current circulating through the conductor, said high current being determined by combining the modified third portion of the first light pulse modified in the third sensing branch and received by the second receiver, the modified third portion of the second light pulse modified in the third sensing branch and received by the first receiver.

\* \* \* \* \*